United States Patent
Eguchi et al.

(10) Patent No.: US 10,405,469 B2
(45) Date of Patent: Sep. 3, 2019

(54) COMPONENT SUPPLYING DEVICE AND COMPONENT SUPPLYING METHOD

(71) Applicant: Panasonic Intellectual Property Management Co., Ltd., Osaka (JP)

(72) Inventors: Ryouji Eguchi, Yamanashi (JP); Tatsuo Yamamura, Fukuoka (JP); Daisuke Mizokami, Yamanashi (JP); Masahiro Hayashizaki, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 272 days.

(21) Appl. No.: 15/349,248

(22) Filed: Nov. 11, 2016

(65) Prior Publication Data
US 2017/0135255 A1    May 11, 2017

(30) Foreign Application Priority Data
Nov. 11, 2015 (JP) .................................. 2015-221191

(51) Int. Cl.
*H05K 13/04* (2006.01)
*H05K 3/30* (2006.01)
(Continued)

(52) U.S. Cl.
CPC ......... *H05K 13/02* (2013.01); *H05K 13/0417* (2013.01); *H05K 13/0419* (2018.08);
(Continued)

(58) Field of Classification Search
CPC .. H05K 13/02; H05K 13/082; H05K 13/0419; H05K 13/0417; H05K 13/08;
(Continued)

(56) References Cited

U.S. PATENT DOCUMENTS

2015/0212503 A1    7/2015    Shimizu et al.

FOREIGN PATENT DOCUMENTS

JP    2008-270850 A    11/2008
JP    4846628 B2    12/2011
(Continued)

OTHER PUBLICATIONS

JP5155084B2_Translated.*

*Primary Examiner* — Thiem D Phan
(74) *Attorney, Agent, or Firm* — Pearne & Gordon LLP

(57) ABSTRACT

A tape feeder (a component supplying device) which transports a carrier tape covered with a cover tape and storing components to a component pick-up position, peels off the cover tape before the component pick-up position, and supplies the stored components to a component mounter, the tape feeder including photo-switch (a detector) which detects presence or absence of tension acting on the cover tape, the cover tape is peeled off from the carrier tape, a feeder storage unit (a storage unit) which stores the presence or absence of tension which is detected by the photo-switch, and an operation determination unit (a determination unit) which determines a processing operation performed when power which is supplied to the tape feeder is reintroduced based on the presence or absence of tension which is detected.

10 Claims, 13 Drawing Sheets

(51) Int. Cl.
*H05K 13/02* (2006.01)
*H05K 13/08* (2006.01)

(52) U.S. Cl.
CPC ........... *H05K 13/08* (2013.01); *H05K 13/082* (2018.08); *Y10T 29/4913* (2015.01); *Y10T 29/5313* (2015.01)

(58) Field of Classification Search
CPC ..... G11B 15/43; G11B 15/1875; G11B 15/48; G01L 5/102; Y10T 29/5313; Y10T 29/4913
USPC .......... 29/740, 729, 832, 428, 720, 739, 833
See application file for complete search history.

(56) References Cited

FOREIGN PATENT DOCUMENTS

JP          5155084 B2 *   2/2013
JP          2015-141910 A   8/2015

* cited by examiner

COMPONENT SUPPLYING DEVICE AND COMPONENT SUPPLYING METHOD

BACKGROUND

1. Technical Field

The present disclosure relates to a component supplying device and a component supplying method which pitch feed a carrier tape in which components are stored.

2. Description of the Related Art

A tape feeder is known as a supplying device of components in a component mounter. The tape feeder supplies components to a component pick-up position of a mounting head of a component mounting mechanism by pitch feeding the carrier tape holding the components, and a plurality of tape feeders are lined up and disposed in slots of a component supplier of the component mounter. The carrier tape is supplied in a state of being wound and stored on a supply reel, and the tape feeder is refilled with the carrier tape after a worker reads a bar-code which is attached to the supply reel to confirm that the component is the refill target component (for example, refer to PTL 1). Accordingly, the tape feeder is associated with information such as the type and number of components which are held by the carrier tape with which the tape feeder is refilled.

When the type of mounted board to be produced is changed, a so-called set-up change is performed in which preparation is performed such that the components to be mounted onto the mounted board to be produced next are supplied from the component supplier. In the set-up change, work is performed in which the tape feeder which supplies the components which are not to be mounted onto the mounted board to be produced next is removed from the component supplier, and another tape feeder which supplies the components to be mounted is attached to the vacated slot. The removed tape feeder is either attached to another component mounter or is stored in a state of being attached to a storage carriage, or the like.

CITATION LIST

Patent Literature

PTL 1: Japanese Patent No. 4846628

SUMMARY

A component supplying device of the disclosure transports a carrier tape covered with a cover tape and storing components to a component pick-up position, peels off the cover tape before the component pick-up position, and supplies the stored components to a component mounter, the component supplying device including a detector which detects presence or absence of tension acting on the cover tape, the cover tape is peeled off from the carrier tape, a storage unit which stores the presence or absence of tension which is detected by the detector, and a determination unit which determines a processing operation performed when power which is supplied to the component supplying device is reintroduced, based on the presence or absence of tension which is detected.

A component supplying method of the disclosure in a component supplying device which transports a carrier tape covered with a cover tape and storing components to a component pick-up position, peels off the cover tape before the component pick-up position, and supplies the stored components to a component mounter, the method including detecting presence or absence of tension acting on the cover tape, the cover tape is peeled off from the carrier tape, storing the presence or absence of tension which is detected, and determining a processing operation of performed when power which is supplied to the component supplying device is reintroduced based on the presence or absence of tension which is detected.

According to the disclosure, it is possible to prevent erroneous supplying of components caused by a carrier tape being detached from a tape feeder while the power is turned off.

DETAILED DESCRIPTION

Before describing the embodiment of the disclosure, a concise description will be given of the problems in the device of the related art.

The following problems are present in the related art including PTL 1 in a state in which the tape feeder is removed from the component mounter to be stored. In other words, in a state in which the tape feeder is removed from the component mounter and the power is turned off, there is no record of a carrier tape being detached from the tape feeder. Therefore, since the component mounter performs production based on associated information which is stored before the power is turned off, even in a case in which another carrier tape is accidentally mounted to the tape feeder after the carrier tape falls out from the tape feeder in a state in which the power is turned off, incorrect components may be mounted onto the board.

Therefore, an object of this disclosure is to provide a component supplying device and a component supplying method capable of preventing erroneous supplying of components caused by the carrier tape being detached from the tape feeder while the power is turned off.

Exemplary Embodiment

Figure 2:
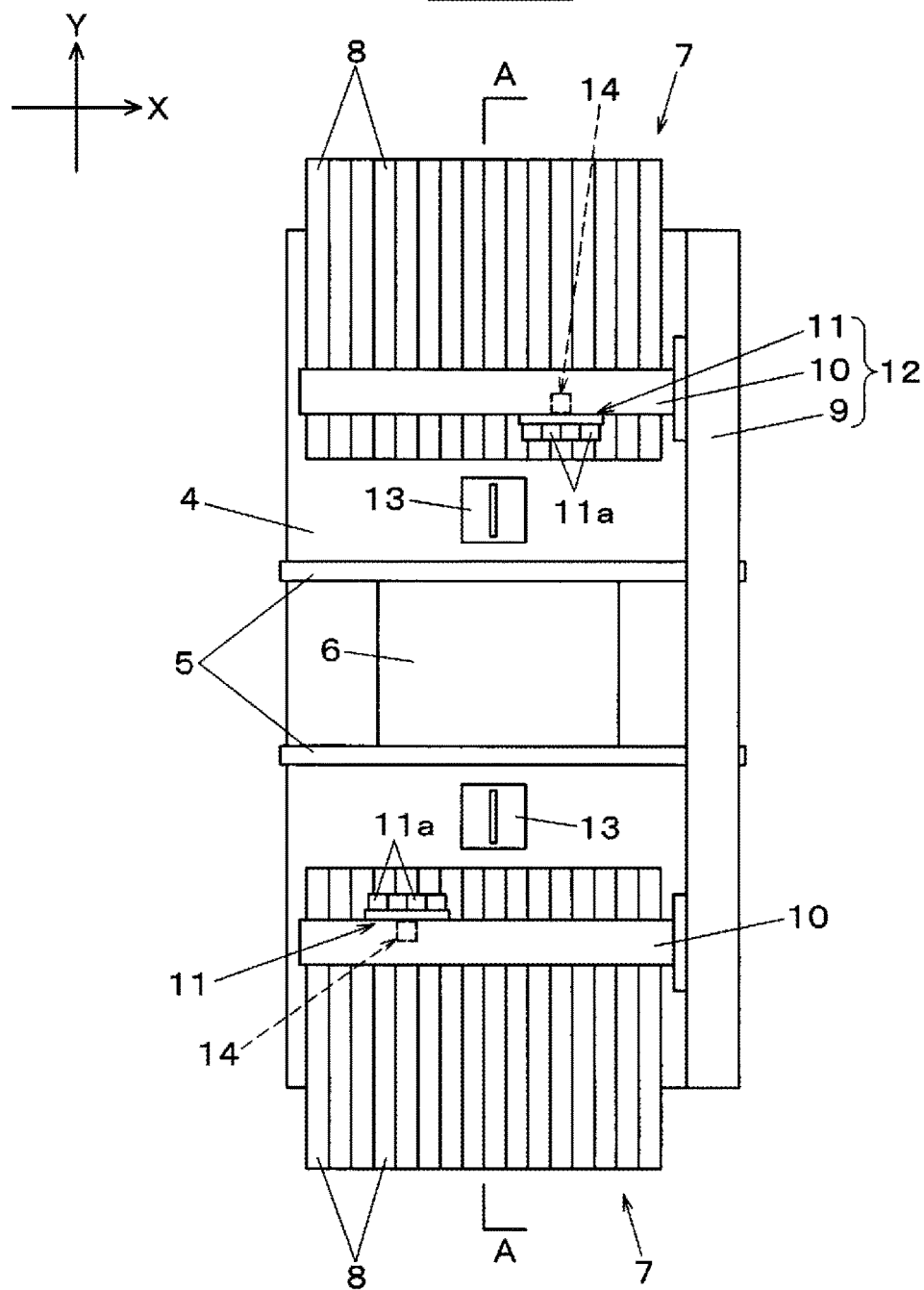
FIG. 2 is a plan view of a component mounter of an embodiment of the disclosure.
Figure 3:
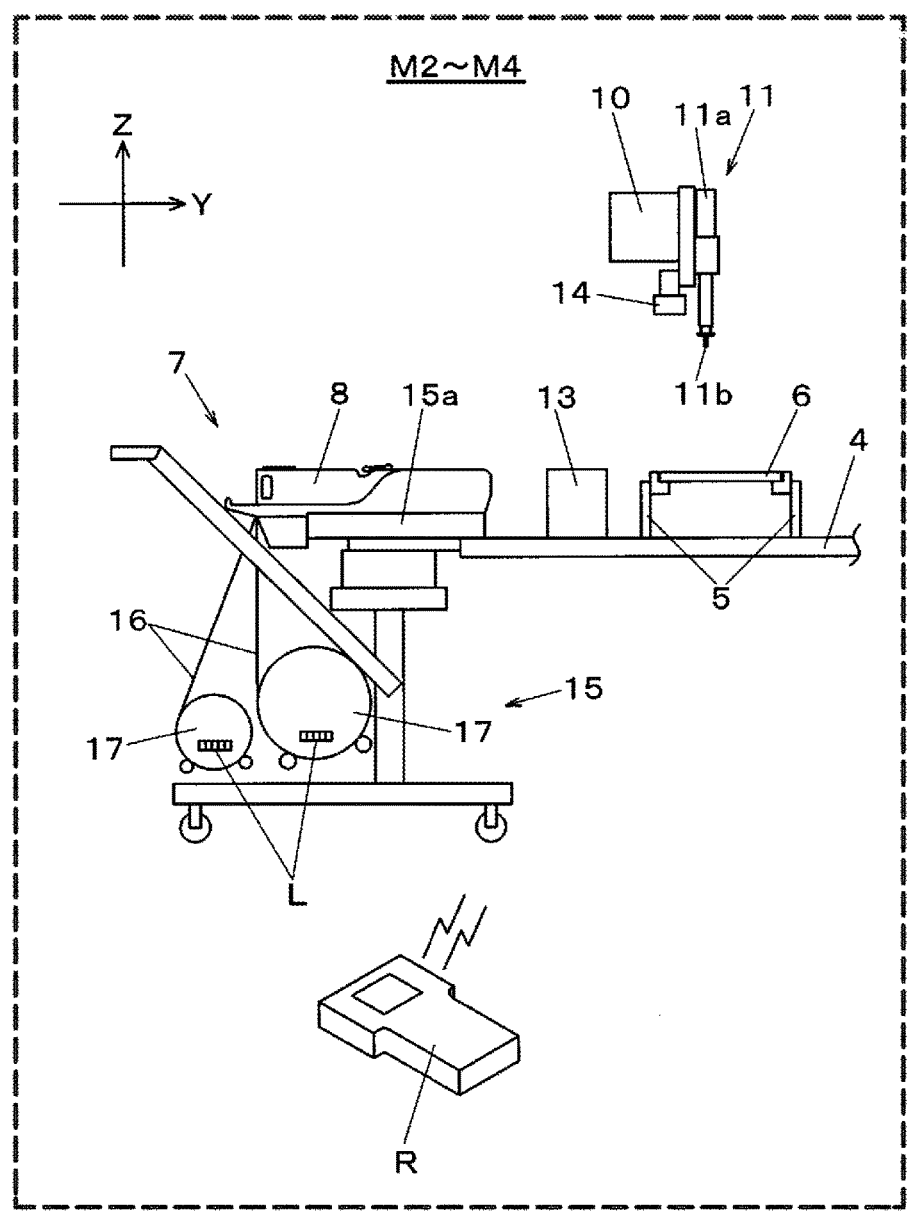
FIG. 3 is a partial sectional diagram of the component mounter of an embodiment of the disclosure.

Hereinafter, detailed description will be given of an embodiment of the present disclosure using the drawings. The configurations, forms, and the like described hereinafter are examples to facilitate explanation, and may be modified, as appropriate, according to the design of the component mounting system. Hereinafter, elements corresponding to each other are given the same symbols in all of the drawings, and duplicated description is omitted. An X direction (the left-right direction in FIG. 2) in the board transport direction and a Y direction (the front-back direction in FIG. 2) perpendicular to the board transport direction are illustrated in FIG. 2 and some parts described later as two axial directions which orthogonally intersect each other in a horizontal plane. A Z direction is illustrated in FIG. 3 and some parts described later as a height direction which orthogonally intersects the horizontal plane. The Z direction is the up-down direction or a perpendicular direction in a case in which the component mounting system is installed on the horizontal plane.

Figure 1:
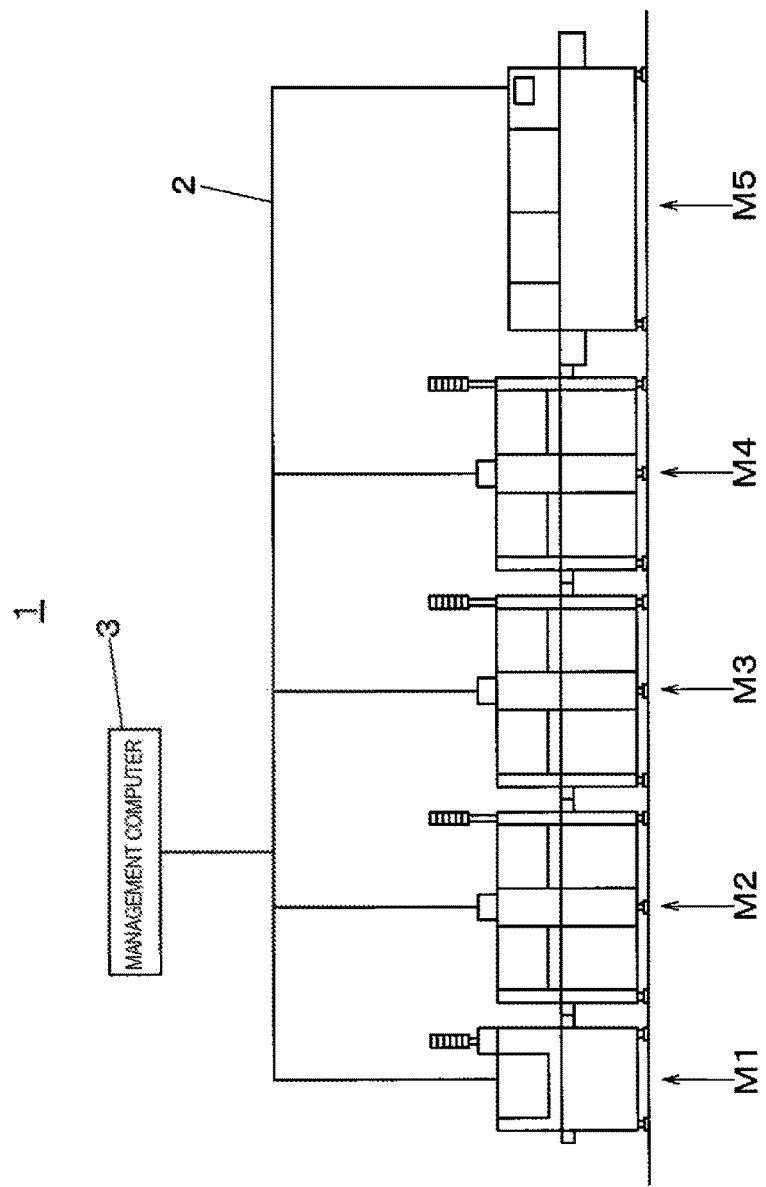
FIG. 1 is an explanatory diagram of the configuration of a component mounting system of an embodiment of the disclosure.

First, description will be given of the component mounting system with reference to FIG. 1. In FIG. 1, component mounting system 1 is configured to connect each device of printer M1, component mounters M2 to M4, and reflow device M5, to each other using communication network 2, and to perform overall control using management computer 3. Component mounting system 1 includes a function of manufacturing a mounted board by mounting components onto a board.

Printer M1 screen prints paste-form solder onto electrodes for component connection which are formed on the board. Component mounters M2 to M4 perform component mounting work of picking up a component from a part feeder such as tape feeders which are arranged in a component supplier and transferring and placing the component on the board using a mounting head. Subsequently, the mounted board is manufactured by the board being sent to reflow device M5 after the component mounting, and the components which are mounted onto the board being soldered to the board.

Next, description will be given of the configuration of component mounters M2 to M4 with reference to FIGS. 2 and 3. FIG. 3 partially illustrates the cross-section taken along line A-A in FIG. 2. Component mounters M2 to M4 include a function of mounting components which are supplied from a component supplying unit onto a board. In FIG. 2, board transport mechanism 5 is arranged in the X direction in the center of table 4. Board transport mechanism 5 transports board 6 which is carried in from the upstream side, and positions and holds board 6 on a mounting stage which is set in order to execute component mounting work. Component suppliers 7 are disposed on both sides of board transport mechanism 5, and a plurality of tape feeders 8 are mounted in parallel in each component supplier 7. Tape feeder 8 supplies a component to a component pick-up position of a mounting head of a component mounting mechanism described hereinafter by pitch feeding a carrier tape storing components in a tape feed direction.

Y-axis moving table 9 including a linear drive mechanism is arranged on the end of one side on the top surface of table 4 in the X direction. Two X-axis moving tables 10 similarly including linear drive mechanisms are joined to Y-axis moving table 9 to be freely movable in the Y direction. Mounting head 11 is mounted on each of two X-axis moving tables 10 to be freely movable in the X direction. Mounting head 11 is a multi-head mounting head including a plurality of holding heads 11a, and, as illustrated in FIG. 3, suction nozzles 11b which suck and hold components and are capable of being lifted and lowered individually are mounted to the bottom end of each holding head 11a.

Mounting head 11 moves in the X direction and the Y direction due to Y-axis moving table 9 and X-axis moving table 10 being driven. Accordingly, two mounting heads 11 suck, hold, and pick up components from the component pick-up positions of tape feeders 8 disposed on component suppliers 7 corresponding to each mounting head 11 using suction nozzles 11b, and move and place the components on mounting points on board 6 which is positioned in board transport mechanism 5. Y-axis moving table 9, X-axis moving table 10, and mounting head 11 form component mounting mechanism 12 which moves and places components onto board 6 by moving mounting heads 11 holding components.

Component recognition camera 13 is arranged between component supplier 7 and board transport mechanism 5. When mounting head 11 which picked up the component from component supplier 7 moves above component recognition camera 13, component recognition camera 13 images the component in the state of being held by mounting head 11 and recognizes the holding orientation of the component. Board recognition cameras 14 which move integrally with each mounting head 11 are mounted to the bottom surface of X-axis moving table 10.

Due to the movement of mounting head 11, board recognition camera 14 moves above board 6 which is positioned in board transport mechanism 5, and board recognition camera 14 images board 6 and recognizes the state of board 6. In a component mounting operation to board 6 carried out by mounting head 11, placement position correction is performed, taking into account recognition results of the component by component recognition camera 18 and board recognition results by board recognition camera 14.

As illustrated in FIG. 3, carriage 15 is set in component supplier 7 in a state in which a plurality of tape feeders 8 are mounted to feeder base 15a in advance. Feeder addresses for specifying a feeder position at which each individual tape feeder 8 is mounted are set in feeder base 15a, and in the component mounting work, each tape feeder 8 on feeder base 15a is specified via these feeder addresses.

The position of carriage 15 on component supplier 7 is fixed by clamping feeder base 15a to table 4 using a clamp mechanism (not illustrated). Supply reels 17 storing carrier tapes 16 in a wound state are held in carriage 15, and carrier tapes 16 hold the components. Carrier tape 16 which is pulled out from supply reel 17 is pitch fed by tape feeder 8 to the component pick-up position of suction nozzle 11b.

Barcode label L (identification information) is bonded to each supply reel 17 in advance, and when performing the component refilling work, bar-code label L is read by bar-code reader R. The reading results are transmitted to management computer 3 via wireless receiver 51, are further transmitted from management computer 3 to component mounters M2 to M4, and from component mounters M2 to M4 to tape feeder 8 (refer to FIGS. 6A and 6B).

Figure 4A:
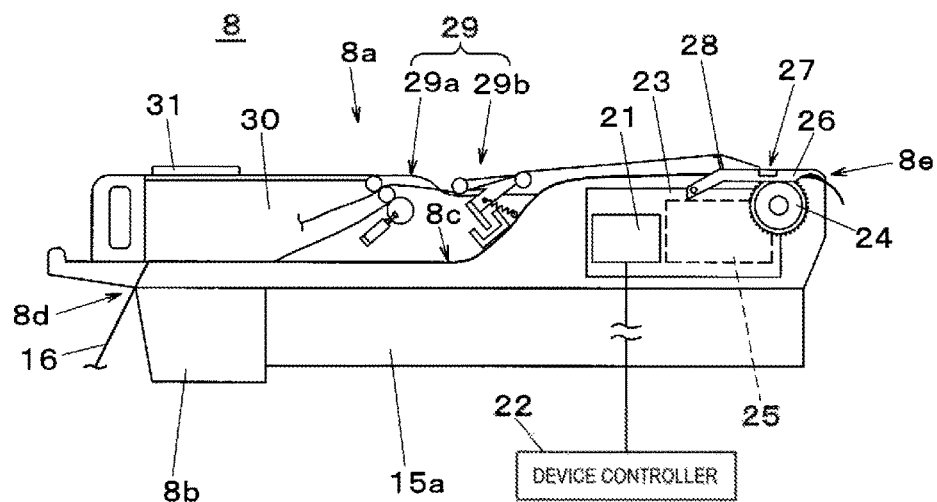
FIG. 4A is an explanatory diagram of the configuration of a tape feeder of an embodiment of the disclosure.

Next, description will be given of the configuration and functions of tape feeder 8, with reference to FIGS. 4A to 4C. Tape feeder 8 (the component supplying device) has a function of transporting carrier tape 16, which stores the components and is covered by a cover tape, to the component pick-up position, and peeling off the cover tape before the component pick-up position to supply the stored components to component mounters M2 to M4. As illustrated in FIG. 4A, tape feeder 8 is configured to include main body portion 8a, and mounting portion 8b provided to protrude downward from the bottom surface of main body portion 8a. In a state in which tape feeder 8 is mounted with the bottom surface of main body portion 8a aligned with feeder base 15a, tape feeder 8 is fixed and mounted to component supplier 7, and feeder controller 21 which is embedded in order to control the tape feeding in tape feeder 8 is electrically connected to device controller 22 of component mounters M2 to M4.

Tape transport path 8c is provided inside main body portion 8a and guides carrier tape 16 which is pulled out from supply reel 17 and taken into main body 8a. Tape transport path 8c is provided to communicate from insertion port 8d to discharge port 8e. Insertion port 8d is opened at the upstream end of main body portion 8a in the tape feed direction and carrier tape 16 is inserted therethrough. Discharge port 8e is opened downstream of the component pick-up position at which mounting head 11 picks up the components.

Figure 4B:
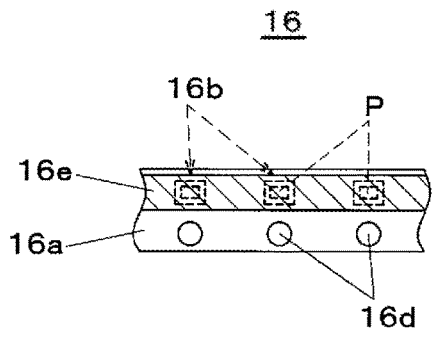
FIG. 4B is an explanatory diagram of the structure of a carrier tape of an embodiment of the disclosure.
Figure 4C:
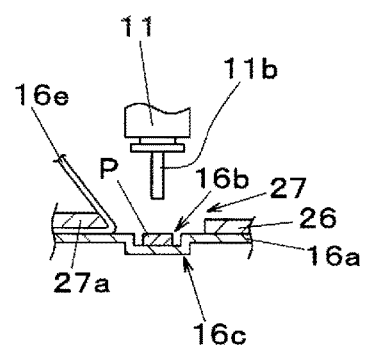
FIG. 4C is an enlarged view of the vicinity of a component pick-up position of the tape feeder of an embodiment of the disclosure.

In FIGS. 4B and 4C, carrier tape 16 is configured such that feed holes 16d for pitch feeding component pockets 16b and carrier tape 16 which store and hold components P are provided at a predetermined pitch in base tape 16a which forms the tape body. Embossed portions 16c which protrude downward are provided in positions corresponding to component pockets 16b in the bottom surface of base tape 16a. Cover tape 16e covers component pockets 16b to seal the top surface of base tape 16a in order to prevent components P from falling out from component pockets 16b.

In FIG. 4A, tape feed mechanism 23 for pitch feeding carrier tape 16 is embedded in main body portion 8a. The axial line of tape feed mechanism 23 is perpendicular to the tape feed direction at the end on the downstream side of main body portion 8a, and tape feed mechanism 23 includes sprocket 24 which is disposed at a horizontal orientation, and drive mechanism 25 which rotationally drives sprocket 24. Carrier tape 16 is pitch fed along tape transport path Sc by driving drive mechanism 25 in a state in which feed pins 24a (refer to FIG. 5) which are provided on the outer circumference of sprocket 24 are engaged with feed holes 16d of carrier tape 16. Tape feed mechanism 23 is controlled by feeder controller 21.

In FIG. 4C, The front side of sprocket 24 (refer to FIG. 4A) is the component pick-up position at which component P inside component pocket 16b is sucked and picked up by suction nozzle 11b of mounting head 11. Retaining member 26 is arranged on the top surface side of main body portion 8a (refer to FIG. 4A) in the vicinity of sprocket 24. Opening portion 27 corresponding to the component pick-up position of suction nozzle 11b is provided in retaining member 26. The upstream end of opening portion 27 serves as cover tape peeling off portion 27a for peeling off cover tape 16e.

Carrier tape 16 is pitch fed in a state of being retained in tape transport path 8c by retaining member 26. In the process in which carrier tape 16 runs under retaining member 26, cover tape 16e is rotated around a circumference by cover tape peeling off portion 27a and pulled out to the upstream side, and thus, cover tape 16e is peeled off from base tape 16a at the upstream side of the component pick-up position. Accordingly, component P inside component pocket 16b is exposed at the top in opening portion 27, and assumes a state in which suction nozzle 11b is capable of picking up component P.

In FIG. 4A, protruding portion 28 which protrudes upward is provided on the upstream side in the pitch feed direction of opening portion 27 of retaining member 26. Cover tape 16e which is peeled off from base tape 16a at the tape peeling off position and is turned around is guided to the opposite side from the pitch feed direction by cover tape feed mechanism 29 via the top surface of protruding portion 28. Cover tape feed mechanism 29 includes feed drive mechanism 29a and tension guide mechanism 29b. Tension is applied to cover tape 16e, which is guided via the top surface of protruding portion 28, by tension guide mechanism 29b to guide cover tape 16e, and cover tape 16e is fed into tape collector 30, which is provided on the upstream side of main body portion 8a, by feed drive mechanism 29a.

In FIG. 4A, operation and display panel 31 which is connected to feeder controller 21 is disposed on the top surface of the upstream side of tape feeder 8. Various types of operation button are provided on operation and display panel 31. Examples of operation buttons are operation buttons for operating a tape feed operation and a tape return operation carried out by tape feed mechanism 23, and a cover tape feed operation carried out by cover tape feed mechanism 29, and input buttons for writing component IDs to the embedded memory of tape feeder 8. A notification lamp for performing notification of predetermined items which are set in advance is provided on operation and display panel 31.

Figure 5:
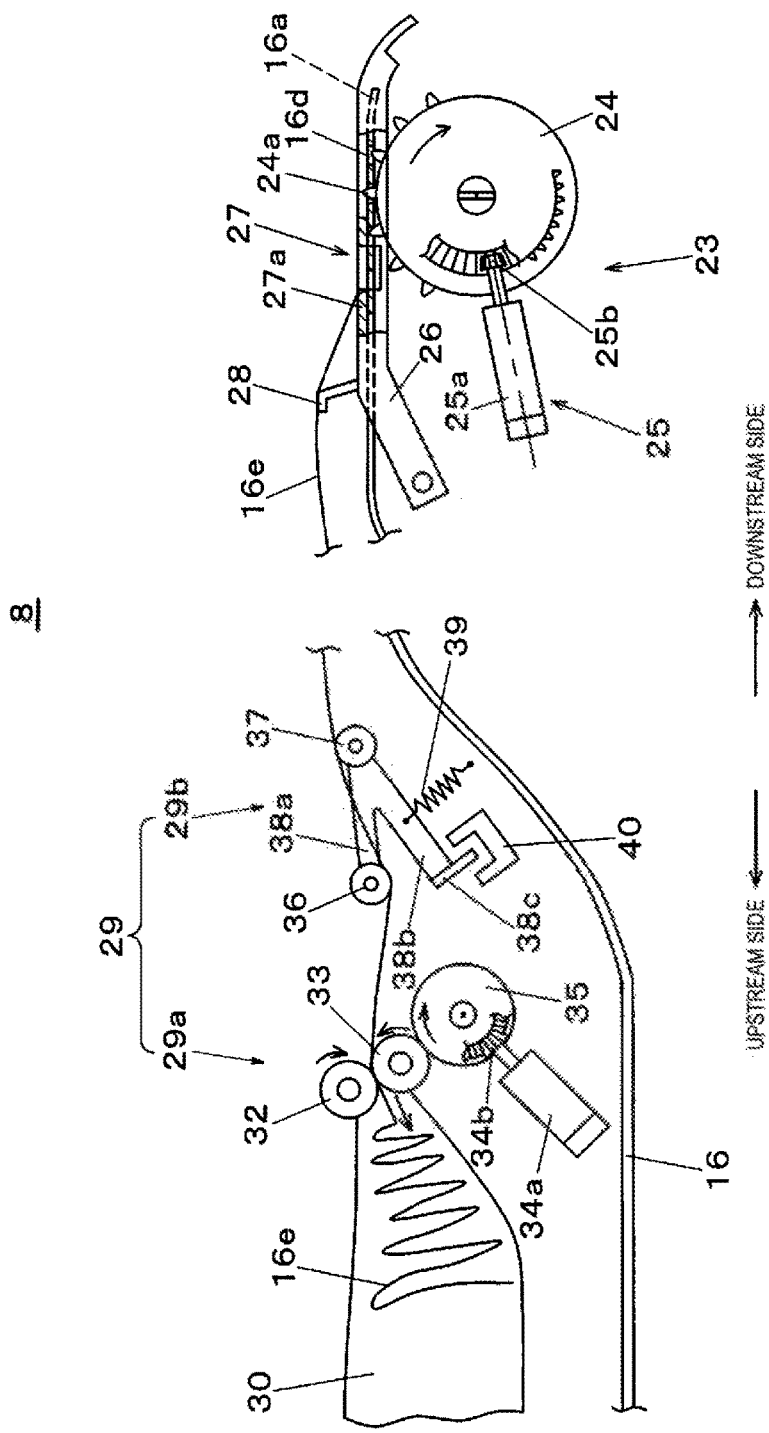
FIG. 5 is an explanatory diagram of the structure of a pitch feed mechanism and a cover tape feed mechanism of the tape feeder of an embodiment of the disclosure.

Next, description will be given of the configuration and functions of tape feed mechanism 23 and cover tape feed mechanism 29 with reference to FIG. 5. In FIG. 6, sprocket 24 which pitch feeds carrier tape 16 is rotationally driven by motor 25a via bevel gear 25b, and performs an intermittent rotation operation corresponding to the pitch feed operation. Pins 24a are provided at a fixed pitch on the outer circumference of sprocket 24, and the tape feeding is performed due to sprocket 24 rotating in a state in which pins 24a are engaged with feed holes 16d which are provided in carrier tape 16. Feeder controller 21 controls the tape feeding by controlling the rotation of motor 25a.

Retaining member 26 which retains carrier tape 16 in tape transport path 8c is arranged in the vicinity of sprocket 24. The upstream end of opening portion 27 which is provided in retaining member 26 serves as cover tape peeling off portion 27a for peeling off cover tape 16e. Cover tape 16e which is peeled off from carrier tape 16 which is pitch fed to the downstream side is guided to cover tape feed mechanism 29 via protruding portion 28 which is provided to protrude upward on the upstream side of opening portion 27 in retaining member 26.

Cover tape 16e which is guided and turned around by cover tape feed mechanism 29 is fed into tape collector 30 by rotation feed members 32 and 33 which are provided in feed drive mechanism 29a. The rotational driving of rotation feed members 32 and 33 is performed by transmitting the rotation of motor 34a to rotation feed member 33 via bevel gear 34b and transmission gear member 35.

Tension guide mechanism 29b which includes movable tension roller 36 is arranged on the front side of feed drive mechanism 29a. Tension roller 36 is held by level member 38a which has a fulcrum which is coaxial with guide roller 37. Peeled off cover tape 16e is rotated around a circumference on the top side of guide roller 37 and the bottom side of tension roller 36, and is guided to feed drive mechanism 29a. Spring 39 is joined to arm member 38b which is integral with lever member 38a, and lever member 38a and arm member 38b are constantly biased downward by spring 39. Accordingly, tension is applied to cover tape 16e by tension roller 36.

Next, description will be given of an operation of tension guide mechanism 29b. In FIG. 5, when slack arises in cover tape 16e at the position of tension guide mechanism 29b, tension roller 36 moves downward. At the same time, arm member 38b rotates due to the biasing force of spring 39 and dog 38c, which is provided on the tip of arm member 38b, is displaced downward. The slack of cover tape 16e is detected due to the displacement being detected by photo-switch 40.

If the slack is detected, motor 34a is rotationally driven right away, slack cover tape 16e is fed into tape collector 30, and a predetermined tape tension is maintained. At this time, dog 38c is displaced upward and photo-switch 40 turns off (refer to FIG. 12B). In other words, when photo-switch 40 detects the off-state during a fixed period in which feed drive mechanism 29a is driven, it is possible to determine that cover tape 16e is in tension guide mechanism 29b (there is a tension acting on cover tape 16e).

Figure 10A:
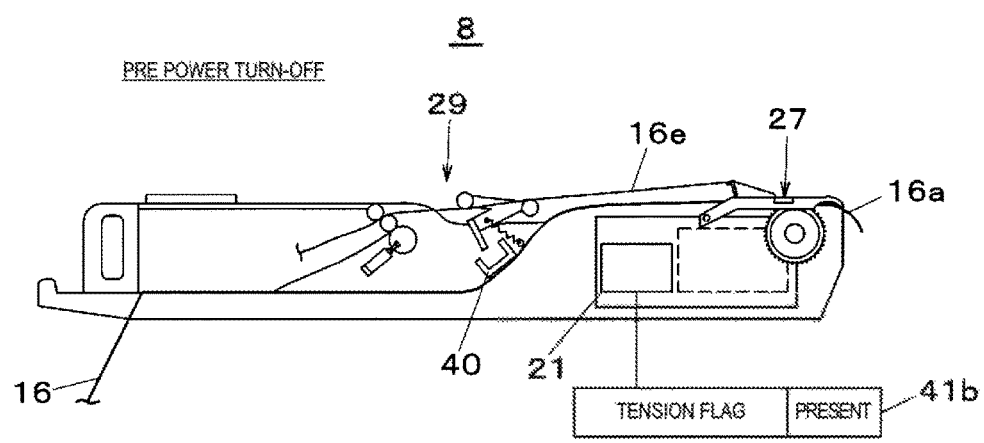
FIG. 10A is a diagram illustrating the determination of the recovery processing operation in the component supplying method of an embodiment of the disclosure.
Figure 10B:
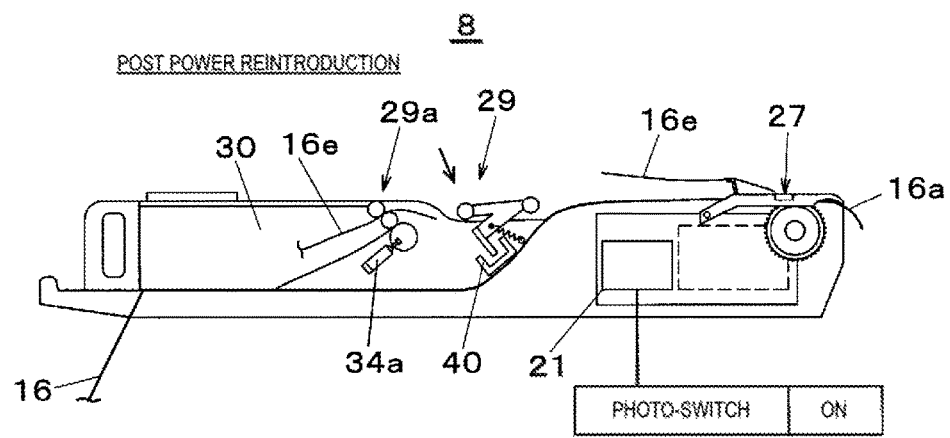
FIG. 10B is a diagram illustrating the determination of the recovery processing operation in the component supplying method of an embodiment of the disclosure.

In a case in which cover tape 16e is not in tension guide mechanism 29b, photo-switch 40 continues to detect the on-state without dog 38c being displaced upward, even if feed drive mechanism 29a is driven for a fixed time (refer to FIG. 10B). Accordingly, it is possible to determine that cover tape 16e is not in tension guide mechanism 29b (no tension is acting on cover tape 16e). In this manner, photo-switch 40 serves as a detector which detects whether or not tension is acting on peeled off cover tape 16e.

Figure 6A:
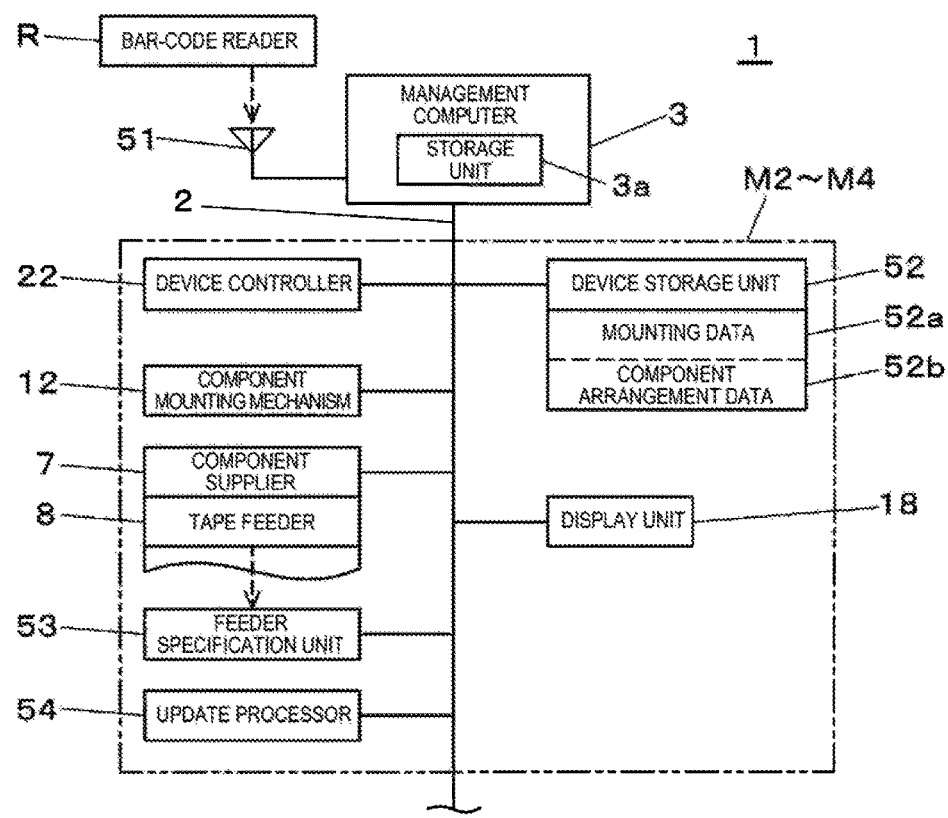
FIG. 6A is a block diagram illustrating the configuration of a control system of the component mounting system of an embodiment of the disclosure.
Figure 6B:
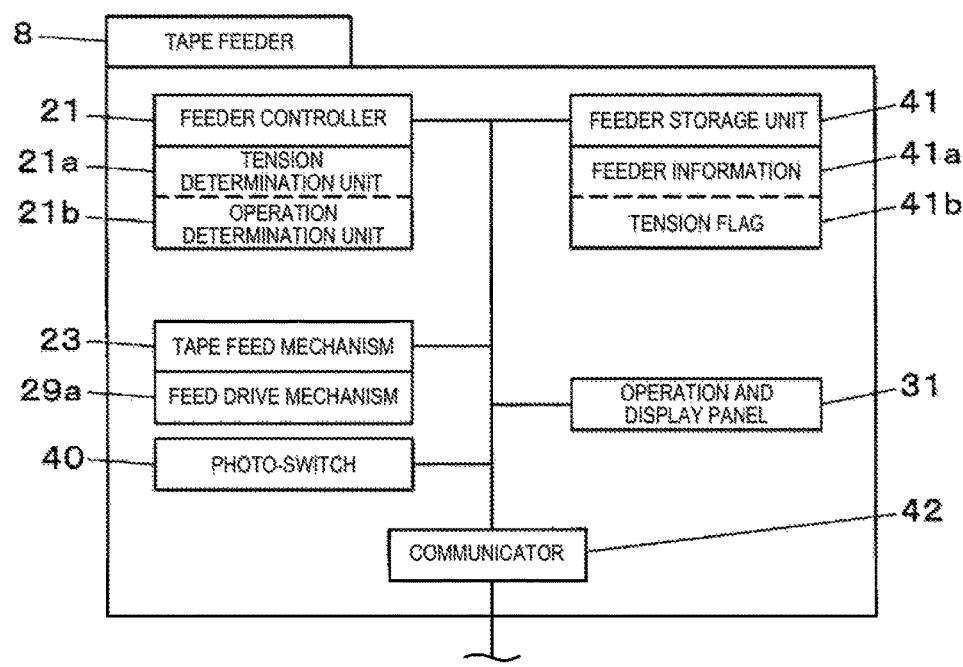
FIG. 6B is a block diagram illustrating the configuration of a control system of the tape feeder of an embodiment of the disclosure.

Next, description will be given of the configuration of the control system of component mounting system 1 with reference to FIGS. 6A and 6B. Component mounting system 1 is configured to include tape feeder 8 (a component supplying device), and component mounters M2 to M4. FIG. 6A illustrates the overall configuration of component mounting system 1, and FIG. 6B illustrates the configuration of tape feeder 8, a plurality of which are mounted to each component supplier 7 of component mounters M2 to M4.

In FIG. 6A, management computer 3 is connected to component mounters M2 to M4 using communication network 2. Management computer 3 includes wireless receiver 51 which receives a signal from a portable terminal such as bar-code reader R. Management computer 3 includes storage unit 3a, and various data such as production data used in the component mounting work by component mounters M2 to M4 is stored in storage unit 3a. In the component mounting work, the production data is downloaded from management computer 3 and stored in device storage unit 52 of component mounters M2 to M4, and running information of component mounters M2 to M4 is collected by management computer 3.

Each component mounter M2 to M4 includes a device controller 22 which is a computational processor including a CPU function, and device controller 22 controls each of component mounting mechanism 12, component supplier 7, and display unit 18 by executing a processing program which is stored in device storage unit 52. Each component mounter M2 to M4 includes feeder specification unit 53, and update processor 54, which are information processors. During the control process carried out by device controller 22, various types of production data such as mounting data 52a and component arrangement data 62b, which are stored in device storage unit 52, are referred to.

Mounting data 52a is data such as the component type of component P to be mounted, and the mounting position coordinates of the board, and mounting data 52a is stored on a per production target board type basis. Component arrangement data 52b is data defining the feeder address of tape feeder 8 in component supplier 7, and component ID of carrier tape 16 which is mounted to tape feeder 8.

In FIG. 6A, feeder specification unit 53 specifies feeder IDs and feeder addresses of tape feeders 8 which are mounted to component supplier 7 and are capable of transmitting and receiving data, and tape feeders 8 for which a refilling operation of carrier tape 16 is detected. When the refilling of tape feeder 8 with carrier tape 16 is performed ordinarily, update processor 54 performs an update process in which component arrangement data 52b is updated based on component ID which is read by bar-code reader R. Bar-code reader R may be connected to each component mounter M2 to M4 in a wired manner.

Here, a configuration example is given in which feeder specification unit 53, and update processor 54 are processing functions of component mounters M2 to M4; however, these processing functions may be provided as processing functions of management computer 3. Display unit 18 displays various screens and notification information relating to predetermined items which are set in advance which are necessary in the execution of the component mounting work by component mounters M2 to M4.

Next, description will be given of the configuration of the control system of tape feeder 8. In FIG. 6B, tape feeder 8 includes feeder controller 21 which controls tape feed mechanism 23 and feed drive mechanism 29a. The control is performed based on control signals from component mounters M2 to M4, operation input from operation and display panel 31, and signals from photo-switch 40. Feeder controller 21 is connected to device controller 22 of component mounters M2 to M4 via communicator 42.

During the control process carried out by feeder controller 21, various types of data such as feeder information 41a and tension flag 41b, which are stored in feeder storage unit 41 with which tape feeder 8 is provided, are referenced. Component ID of carrier tape 16 which is mounted to tape feeder 8 is stored in feeder information 41a. Tension flag 41b is information indicating whether or not tension is acting on peeled off cover tape 16e. In other words, feeder storage unit 41 serves as a storage unit which stores whether or not tension is acting on peeled off cover tape 16e which is detected by photo-switch 40 (the detector).

Feeder controller 21 includes tension determination unit 21a and operation determination unit 21b as internal processing functions. Tension determination unit 21a determines whether or not tension is acting on peeled off cover tape 16e. Specifically, in a case in which photo-switch 40 detects the off-state, it is determined that there is tension. In a case in which photo-switch 40 continues to detect the on-state, it is determined that there is not tension. Operation determination unit 21b is a determination unit which determines the processing operation when the power, which is supplied to tape feeder 8 (the component supplying device)

based on whether or not tension is acting on peeled off cover tape 16e which is detected, is reintroduced.

In a case in which photo-switch 40 detects the on-state, tension determination unit 21a may perform the detection of photo-switch 40 again after driving feed drive mechanism 29a for a fixed time. Tension determination unit 21a and operation determination unit 21b may perform the tension determination and the processing operation determination based on the results which are detected by photo-switch 40 and, subsequent to the detection, the results which are detected again after driving feed drive mechanism 29a for a fixed time.

Incidentally, there is a case in which, during the set-up change in which the mounted board to be produced is changed, tape feeder 8 which is not used in the next production is removed from component supplier 7 and is stored in a storage carriage or the like. Alternatively, there is a case in which tape feeder 8 is removed from component supplier 7 together with carriage 15 to be exchanged, as a set, with carriage 15 for the next production. In this manner, there is a case in which, while tape feeder 8 is removed from component supplier 7 and is stored, carrier tape 16 falls out from tape feeder 8, peeled off cover tape 16e is cut before being collected in tape collector 30, incorrect carrier tape 16 is accidentally inserted, or the like.

However, in a state in which tape feeder 8 is removed from component supplier 7, and the power which is supplied to tape feeder 8 is turned off, there is no record of carrier tape 16 being detached from tape feeder 8. Therefore, when tape feeder 8 is attached to component supplier 7 again and the power is reintroduced, the confirmation of whether there is a change in the state of carrier tape 16 which is mounted to tape feeder 8 before and after the power being turned off, and a restarting process (described later) which is performed for recovery in a case in which there is a change are performed.

Figure 7:
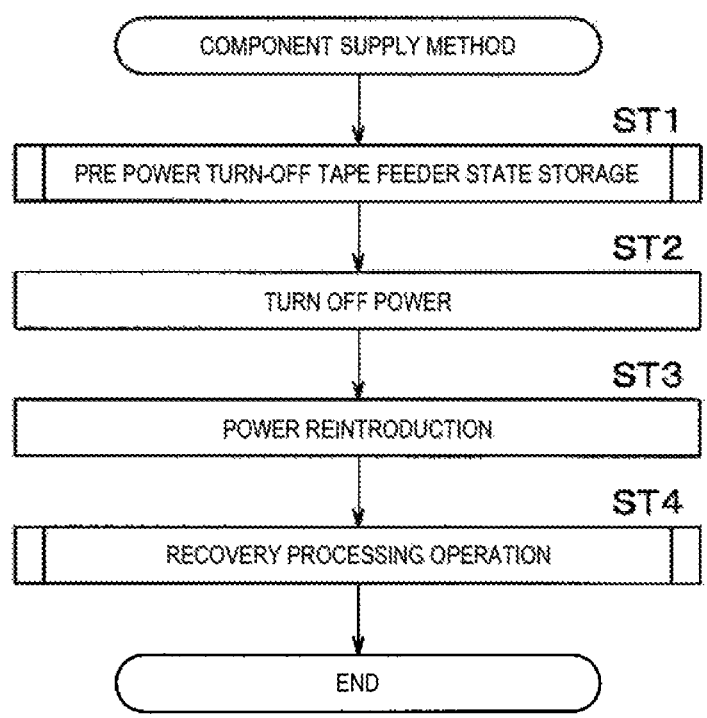
FIG. 7 is a flowchart illustrating a component supplying method of an embodiment of the disclosure.
Figure 8:
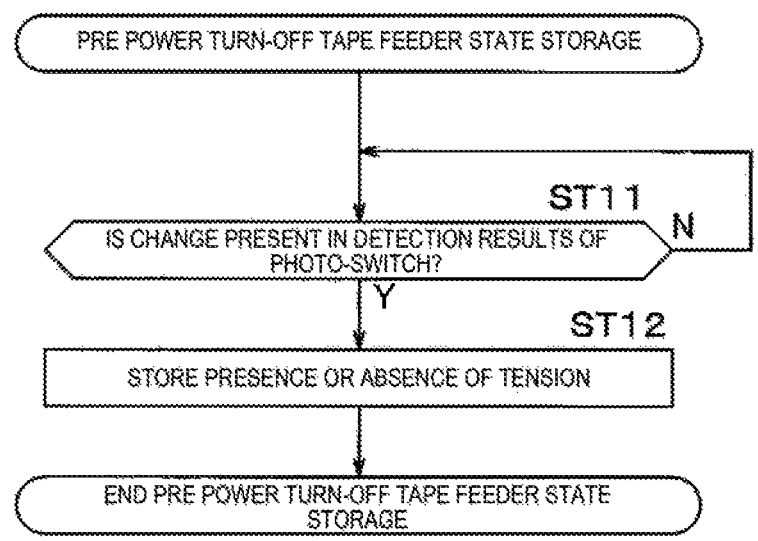
FIG. 8 is a flowchart illustrating a process of storing the tape feeder state before power is turned off in the component supplying method of an embodiment of the disclosure.

Next, description will be given of the component supplying method which determines the processing operation when the power which is supplied to tape feeder 8 (the component supplying device) based on whether or not tension is acting on peeled off cover tape 16e in component mounting system 1 of the embodiment is reintroduced, with reference to FIGS. 7 to 9. In FIG. 7, tension flag 41b is stored in feeder storage unit 41 as the state of carrier tape 16 which is mounted in tape feeder 8 before the power is turned off (ST1: pre power turn-off state storage step). Subsequently, the power of tape feeder 8 is turned off due to tape feeder 8 being removed from component supplier 7 (ST2). Next, when the power of tape feeder 8 is reintroduced due to tape feeder 8 being reattached to component supplier 7 (ST3), a recovery process which is carried out when the power is reintroduced in tape feeder 8 is performed (ST4: recovery process step).

Next, detailed description will be given of the pre power turn-off state storage step (ST1), with reference to FIG. 8. When there is a change in the detection results of photo-switch 40 in tape feeder 8 (Yes in ST11), tension determination unit 21a determines whether or not tension is acting on peeled off cover tape 16e. In a case in which there is a change in the presence or absence of tension, tension flag 41b is updated and stored in feeder storage unit 41 (ST12), and the pre power turn-off state storage step (ST1) is ended.

In this manner, before the power is turned off, tape feeder 8 (the component supplying device) detects whether or not tension is acting on peeled off cover tape 16e using photo-switch 40 (the detector), updates tension flag 41b, and stores the detected presence or absence of tension in feeder storage unit 41. Even if the pre power turn-off state storage step (ST1) is repeatedly performed while the power is being conducted in tape feeder 8, the pre power turn-off state storage step may also be performed when (directly before) the power is turned off.

Next, detailed description will be given of the recovery process step (ST4), with reference to FIG. 9. First, when the power is reintroduced (is being conducted) again in tape feeder 8 (ST3), whether or not tension is acting on peeled off cover tape 16e is detected by tension determination unit 21a (ST21: a post power reintroduction detection step).

Next, operation determination unit 21b compares the presence or absence of tension indicated by tension flag 41b which is stored in the pre power turn-off state storage step (ST1) with the presence or absence of tension detected in the post power reintroduction detection step (ST21) (ST22: tension presence or absence comparison step). In other words, a comparison is performed as to whether or not the presence or absence of tension indicated by tension flag 41b which is stored when the power is turned off matches the presence or absence of tension detected by photo-switch 40 when the power is reintroduced.

In a case in which the presence or absence of tension before and after the power is turned off does not match in the tension presence or absence comparison step (ST22) (No), since a recovery operation carried out by the worker becomes necessary; operation and display panel 31 is notified of the fact that an abnormality in tape feeder 8 arises (ST23). In other words, operation determination unit 21b determines that the fact an abnormality in tape feeder 8 (the component supplying device) occurs is to be notified as the recovery processing operation. Accordingly, the worker may easily discover tape feeder 8 for which a recovery operation such as remounting cover tape 16e to cover tape feed mechanism 29, or looking up carrier tape 16 is necessary.

Before performing the lookup work of tape feeder 8 for which an abnormality arises, the worker may execute the erasure of component ID of carrier tape 16 from feeder information 41a which is stored in feeder storage unit 41 as a recovery process. Accordingly, it is possible to shorten the time taken by the lookup work.

Here, description will be given of examples of abnormalities which arise in tape feeder 8, with reference to FIGS. 10A to 12B. In the example illustrated in FIGS. 10A and 10B, before the power is turned off (FIG. 10A), carrier tape 16 is mounted to tape feeder 8, and peeled off cover tape 16e is fed to the opposite side from the tape feed direction by cover tape feed mechanism 29. At this time, a tension is acting on peeled off cover tape 16e, and the fact that tension is "present" is stored in tension flag 41b. Tension flag 41b may store only the change.

After the power is reintroduced (FIG. 10B), peeled off cover tape 16e is cut before being collected in tape collector 30. In this case, tension determination unit 21a determines that tension is "absent". Therefore, the presence or absence of tension before and after the power is turned off does not match, and operation determination unit 21b determines performing notification of an abnormality after determining that there is an abnormality in tape feeder 8 as a recovery processing operation.

Tension determination unit 21a may cause motor 34a of cover tape feed mechanism 29 to operate after determining that tension is "absent", and may determine whether or not tension is applied to cover tape 16e. By adding this determination, it is possible to determine whether cover tape 16e is slack or cut. Described more specifically, in a case in which cover tape 16e is only slack, when motor 34a is caused to operate for only a predetermined time, tension is applied to cover tape 16e, and tension determination unit 21a determines that tension is "present". Accordingly, it is possible to determine that cover tape 16e is slack.

In a case in which cover tape 16e is cut, even if motor 34a is caused to operate for only a predetermined time, tension is not applied to cover tape 16e, and tension determination unit 21a determines that tension is "absent". Accordingly, it is possible to determine that cover tape 16e is cut.

Figure 11A:
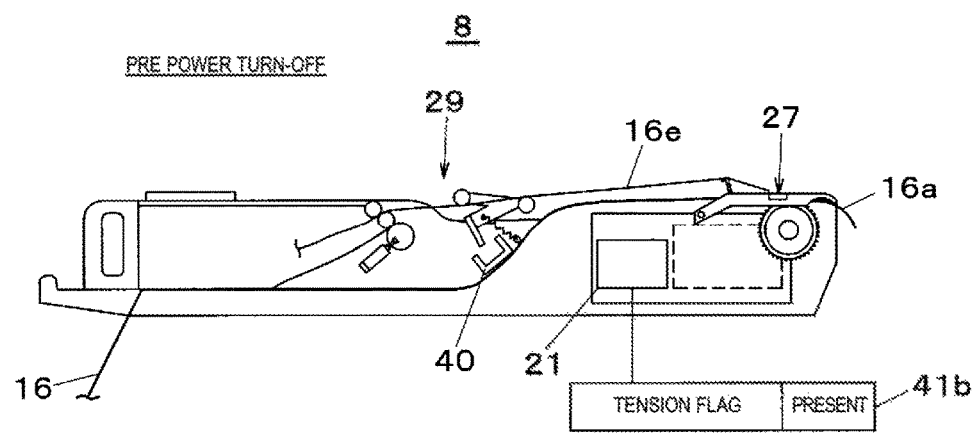
FIG. 11A is a diagram illustrating the determination of the recovery processing operation in the component supplying method of an embodiment of the disclosure.
Figure 11B:
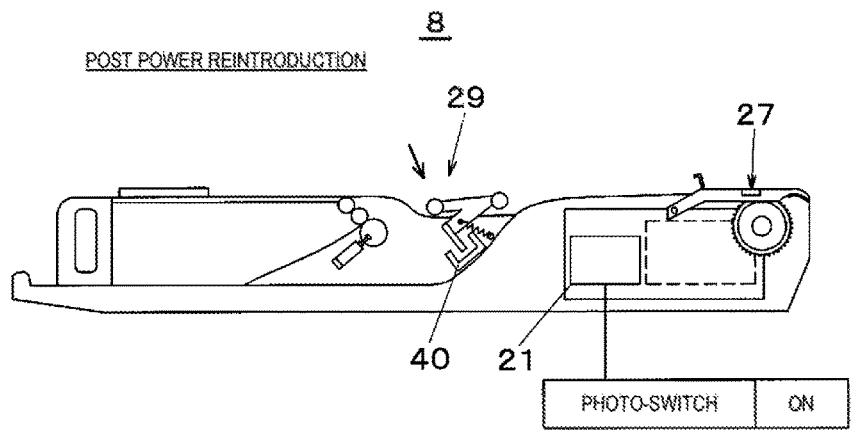
FIG. 11B is a diagram illustrating the determination of the recovery processing operation in the component supplying method of an embodiment of the disclosure.

In the example illustrated in FIGS. 11A and 11B, before the power is turned off (FIG. 11A), carrier tape 16 is ordinarily mounted to tape feeder 8 in the same manner as in FIG. 10A, and the fact that tension is "present" is stored in tension flag 41b. After the power is reintroduced (FIG. 11B), carrier tape 16 falls out from tape feeder 8, and tension is determined to be "absent" by tension determination unit 21a. Therefore, the presence or absence of tension before and after the power is turned off does not match, and operation determination unit 21b determines performing notification of an abnormality (falling out of carrier tape 16) after determining that there is an abnormality in tape feeder 8 as a recovery processing operation.

Figure 12A:
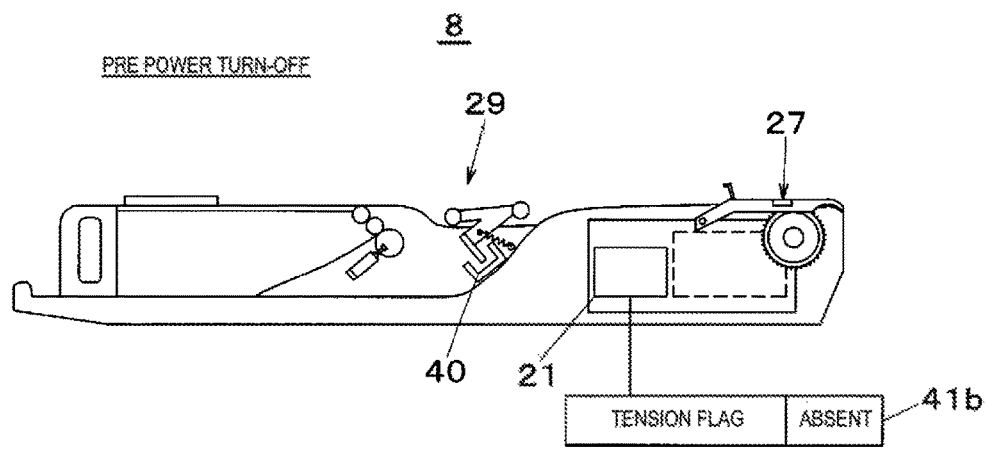
FIG. 12A is a diagram illustrating the determination of the recovery processing operation in the component supplying method of an embodiment of the disclosure.
Figure 12B:
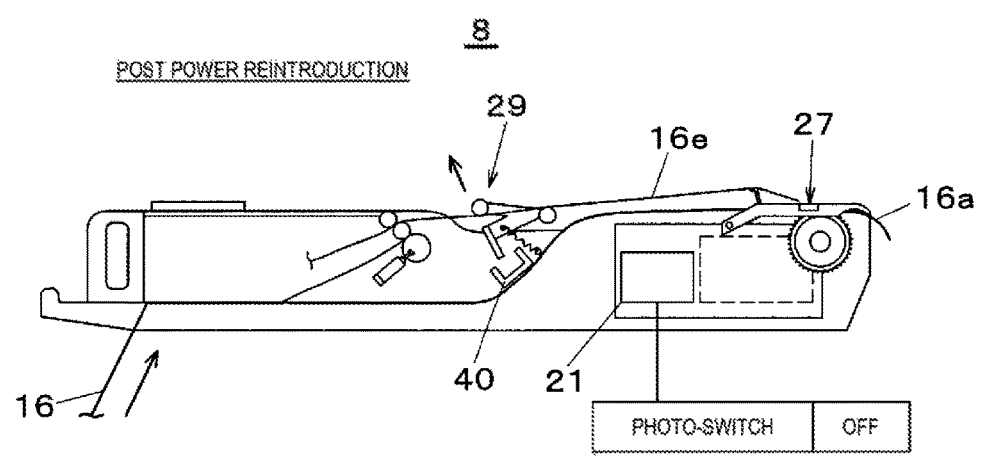
FIG. 12B is a diagram illustrating the determination of the recovery processing operation in the component supplying method of an embodiment of the disclosure.

In the example illustrated in FIGS. 12A and 12B, before the power is turned off (FIG. 12A), carrier tape 16 is not mounted to tape feeder 8, and the fact that tension is "absent" is stored in tension flag 41b. During the time from post power turn off to before power reintroduction, in a case in which different carrier tape 16 is inserted into tape feeder 8, a portion of cover tape 16e which is turned around is manually fed into tape collector 30 using rotation feed members 32 and 33. In this state, cover tape 16e is in a slack state. After the power is reintroduced, since tape feeder 8 causes motor 34a to operate, tension is applied to cover tape 16e. Therefore, tension determination unit 21a determines that tension is "present".

In this manner, since the presence or absence of tension before and after the power is turned off does not match, operation determination unit 21b determines performing notification of an abnormality (indicating carrier tape 16 is to be looked up, assuming that incorrect carrier tape 16 is accidentally inserted or that the power is turned off during the attachment of carrier tape 16) after detecting that there is an abnormality in tape feeder 8 as a recovery processing operation. In this manner, in a case in which the fact that tension is "absent" is stored in tension flag 41b before the power is turned off, the post power reintroduction detection step (ST21) is not performed until motor 34a is operated.

Figure 9:
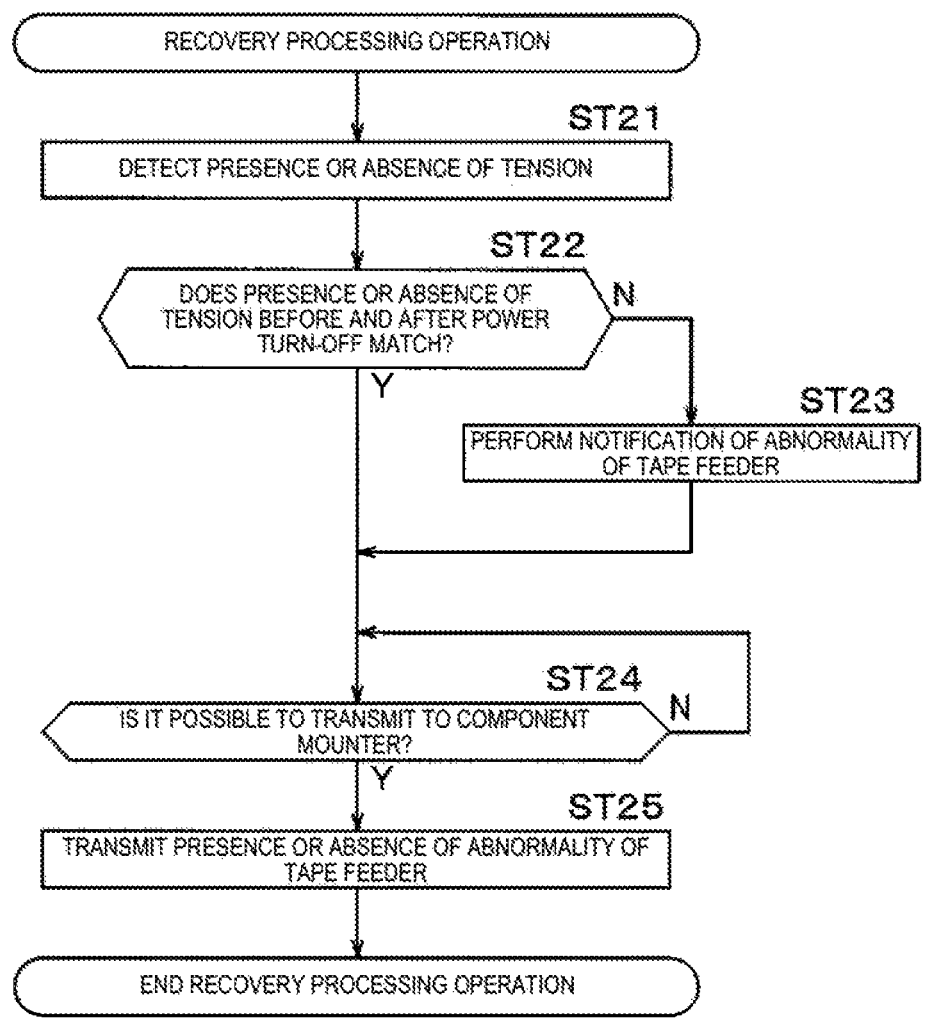
FIG. 9 is a flowchart illustrating recovery processing operation in the component supplying method of an embodiment of the disclosure.

In FIG. 9, in a case in which the presence or absence of tension matches in the tension presence or absence comparison step (ST22) (Yes), it is determined that there is no change (no abnormality) in carrier tape 16 before and after the power is turned off, and the supply operation of the components is restarted. In other words, the operation determination unit 21b determines the restarting of the supply operation of the components as the recovery processing operation.

Next, it is determined whether or not it is possible to transmit the presence or absence of an abnormality in tape feeder 8 to component mounters M2 to M4 using communicator 42 (ST24). In a case in which it is determined that transmission is possible (Yes in ST24), communicator 42 transmits the presence or absence of an abnormality in tape feeder 8 which is detected after the reintroduction of the power to component mounters M2 to M4 (ST25). At this time, the fact that an abnormality is absent is transmitted in a case in which the comparison between tension before and after the power is turned off in tension presence or absence comparison step (ST22) matches, and the fact that an abnormality is present is transmitted in a case in which the comparison does not match.

In component mounters M2 to M4, in a case in which an abnormality is present, information of tape feeder 8 for which an abnormality is detected is displayed on display unit 18. Accordingly, a worker distanced from tape feeder 8 may ascertain tape feeder 8 for which the recovery operation is necessary. In a case in which an abnormality is absent, the component mounting is started. Accordingly, the component mounting is started automatically without requiring the worker to perform an operation. In component mounters M2 to M4, in a case in which the fact that an abnormality is present (non-matching of tension) is transmitted from tape feeder 8, tape feeder 8 may be caused to execute the recovery process which erases component ID of carrier tape 16 from feeder information 41a which is stored in feeder storage unit 41 of tape feeder 8 which performed the transmission.

In a case in which it is determined that transmission is not possible in (ST24) (No), tape feeder 8 holds the presence or absence of tension which is detected after the reintroduction of the power and waits. In other words, in a case in which communicator 42 may not transmit the presence or absence of tension which is detected to component mounters M2 to M4 when the power is reintroduced, tape feeder 8 (the component supplying device) holds the presence or absence of tension which is detected. Therefore, even if time is necessary after tape feeder 8 is remounted to component mounters M2 to M4 and the power is reintroduced until communication becomes possible between component mounters M2 to M4 and tape feeder 8, the state of tape feeder 8 directly after the reintroduction of the power is held. Accordingly, it is possible to correctly determine the recovery processing operation.

As described above, tape feeder 8 (the component supplying device) of the embodiment includes photo-sensor 40 (the detector) which detects the presence or absence of tension acting on peeled off cover tape 16e, detects the presence or absence of tension acting on peeled off cover tape 16e, and stores the detected presence or absence of tension as tension flag 41b.

The processing operation of a time at which the power which is supplied to tape feeder 8 is reintroduced is determined based on the detected presence or absence of tension. Accordingly, while the power is turned off, even if carrier tape 16 falls out from tape feeder 8, new carrier tape 16 is inserted, cover tape 16e is cut, or the like, it is possible to determine the recovery processing operation corresponding to the situation, and it is possible to prevent the incorrect components from being supplied without being noticed.

A configuration may be adopted in which component mounters M2 to M4 include operation determination unit 21b. In this case, tape feeder 8 which is attached to component mounters M2 to M4 transmits the determination results of tension determination unit 21a to component mounters M2 to M4. Operation determination unit 21b which is included in component mounters M2 to M4 determines, from the transmitted information, the processing operation of a time at which the power which is supplied to tape feeder 8 (the component supplying device) is reintroduced. Component mounters M2 to M4 transmit the determined processing operation to tape feeder 8, and tape feeder 8 performs the transmitted processing operation.

Above, description is given based on an embodiment of the disclosure. The embodiment is exemplary, and it is understood by a person skilled in the art that various modification examples to combinations of the constituent elements and the processes are possible, and that such modification examples fall within the scope of the disclosure.

In the tension presence or absence comparison step (ST22) of the embodiment of the disclosure described above, description is given of an embodiment in which the tension state of carrier tape 16 before and after the power is turned off is compared. In the following modification example, the whether or not there is an abnormality in tape feeder 8 is determined from the tension state of carrier tape 16 after the reintroduction of the power, and supplying faults of the components caused by carrier tape 16 being detached from tape feeder 8 while the power is turned off are prevented.

In tape feeder 8 of the modification example, after performing the exchanging of supply reels 17, tape feeder 8 is attached to a device which is capable of supplying power to tape feeder 8 before being attached to component mounters M2 to M4. In tape feeder 8 which is attached, carrier tape 16 is adjusted, and tension is applied to cover tape 16e by tension roller 36. Subsequently, tape feeder 8 is removed, the power is turned off, tape feeder 8 is attached to component mounters M2 to M4, and the power is reintroduced. Therefore, in tape feeder 8 of the modification example, when supply reel 17 is exchanged, tension is applied in a state before tape feeder 8 is attached to component mounters M2 to M4.

When tape feeder 8 is attached to component mounters M2 to M4 and the power is turned on, component mounters M2 to M4 query tape feeder 8 to determine whether or not there is an abnormality. In tape feeder 8 which receives the query from component mounters M2 to M4, tension determination unit 21a determines the presence or absence of tension acting on peeled off cover tape 16e. In a case in which tension determination unit 21a detects that tension is "present", it is determined that the abnormality of tape feeder 8 is "absent". In a case in which tension determination unit 21a detects that tension is "absent", it is determined that the abnormality of tape feeder 8 is "present".

In a case in which it is determined that the abnormality of tape feeder 8 is "present", component mounters M2 to M4 cause tape feeder 8 to execute the recovery process in which component ID of carrier tape 16 is erased from feeder information 41a which is stored in feeder storage unit 41.

In this manner, by determining whether or not there is an abnormality in tape feeder 8 from the tension state of carrier tape 16 after the turning on of the power, it is possible to prevent supplying faults of the components caused by carrier tape 16 being detached from tape feeder 8 while the power is turned off in the same manner as the embodiment of the disclosure described above.

Even in tape feeder 8 of the modification example, in a case in which it is determined that the abnormality in tape feeder 8 is "present" in the same manner as the embodiment of the disclosure, since a recovery operation carried out by the worker becomes necessary; operation and display panel 31 may be notified of the fact that an abnormality in tape feeder 8 arises.

The component supplying device and the component supplying method of the disclosure have the effect of being capable of preventing erroneous supplying of components caused by the carrier tape being detached from the tape feeder while the power is turned off, and are applicable to the field of component mounting in which components taken from a tape feeder disposed in a component supplier are transferred to and placed on a board.

What is claimed is:

1. A component supplying device which transports a carrier tape that stores components and is covered with a cover tape to a component pick-up position, peels off the cover tape before the component pick-up position, and supplies the stored components to a component mounter, the component supplying device comprising:
   a detector which detects presence or absence of tension acting on the cover tape that has been peeled off from the carrier tape;
   a storage unit which stores the presence or absence of tension which is detected by the detector; and
   a determination unit which determines a processing operation performed when power which is supplied to the component supplying device is reintroduced,
   wherein the determination unit compares presence or absence of tension that is stored when power is turned off with the presence or absence of tension detected when power is reintroduced, and
   wherein the determination unit determines the processing operation based on the comparison.

2. The component supplying device of claim 1,
   wherein the storage unit further stores a component ID of a refilled carrier tape, and
   wherein, in a case in which there is no detected tension when power is reintroduced, the determination unit performs erasure of the component ID of the carrier tape which is stored by the storage unit as the processing operation.

3. The component supplying device of claim 1,
   wherein the determination unit determines the processing operation based on whether or not the presence or absence of tension which is stored when power is turned off matches the presence or absence of tension which is detected when power is reintroduced.

4. The component supplying device of claim 1,
   wherein, in a case in which the presence or absence of tension which is stored when power is turned off matches the presence or absence of tension which is detected when power is reintroduced, the determination unit determines restarting of a supply operation of components as the processing operation.

5. The component supplying device of claim 1, further comprising:
   a notification unit which performs notification of a fact that there is an abnormality in the component supplying device,
   wherein, in a case in which the presence or absence of tension which is stored when power is turned off does not match the presence or absence of tension which is detected when power is reintroduced, the determination unit determines performing notification of the fact that there is an abnormality in the component supplying device as the processing operation.

6. A component supplying method in a component supplying device which transports a carrier tape covered with a cover tape and storing components to a component pick-up position, peels off the cover tape before the component pick-up position, and supplies the stored components to a component mounter, the method comprising:
   detecting presence or absence of tension acting on the cover tape, the cover tape is peeled off from the carrier tape;
   storing the presence or absence of tension which is detected; and determining a processing operation of performed when power which is supplied to the component supplying device is reintroduced, wherein the presence or absence of tension that is stored when power is turned off is compared with the presence or absence of tension detected when power is reintroduced, and wherein the processing operation is determined based on the comparison.

7. The component supplying method of claim 6, wherein the component supplying device stores a component ID of a carrier tape when the carrier tape is refilled, and wherein, in a case in which there is no detected tension when power which is supplied to the component supplying device is reintroduced, erasure of the component ID of the carrier tape which is stored is performed as the processing operation.

8. The component supplying method of claim 6, wherein the processing operation is determined based on whether or not the presence or absence of tension which is stored when power is turned off matches the presence or absence of tension which is detected when power is reintroduced.

9. The component supplying method of claim 6, wherein, in a case in which the presence or absence of tension which is stored when power is turned off matches the presence or absence of tension which is detected when power is reintroduced, restarting of a supply operation of the components is determined as the processing operation.

10. The component supplying method of claim 6, wherein, in a case in which the presence or absence of tension which is stored when power is turned off does not match the presence or absence of tension which is detected when power is reintroduced, performing notification of the fact that there is an abnormality in the component supplying device is determined as the processing operation.

* * * * *